United States Patent [19]
Ueda

[11] Patent Number: 5,572,152
[45] Date of Patent: Nov. 5, 1996

[54] LOGIC CIRCUIT WITH THE FUNCTION OF CONTROLLING DISCHARGE CURRENT ON PULL-DOWN AND EMITTER COUPLED LOGIC CIRCUIT

[75] Inventor: Kimio Ueda, Hyogo, Japan

[73] Assignee: Mitsubishi Denki Kabushiki Kaisha, Tokyo, Japan

[21] Appl. No.: 573,604

[22] Filed: Dec. 15, 1995

Related U.S. Application Data

[63] Continuation of Ser. No. 398,843, Mar. 6, 1995, abandoned.

[30] Foreign Application Priority Data

May 6, 1994 [JP] Japan ...................... 6-094306

[51] Int. Cl.$^6$ .................................................. H03K 19/20
[52] U.S. Cl. .................. 326/126; 326/18; 326/75
[58] Field of Search ................................ 326/126, 75, 77, 326/78, 18, 80

[56] References Cited

U.S. PATENT DOCUMENTS

| | | | |
|---|---|---|---|
| 4,628,216 | 12/1986 | Mazumder | 326/126 |
| 4,700,087 | 10/1987 | Stroberger | 326/75 |
| 4,877,977 | 10/1989 | Kokado | 326/126 |
| 4,970,417 | 11/1990 | Kubota | 326/80 |
| 5,287,019 | 2/1994 | Nonaka | 326/126 |

OTHER PUBLICATIONS

"High–Speed Dugutak Circuits", Kai–Yap TOH et al., 1989 IEEE International Solid–State Circuits Conference, pp. 224–225.

Primary Examiner—Edward P. Westin
Assistant Examiner—Andrew Sanders
Attorney, Agent, or Firm—Lowe, Price, LeBlanc & Becker

[57] ABSTRACT

A first current switch circuit 1a outputs a first logic signal and a complementary signal thereof in response to an input logic signal. A pull-up transistor Q10 has a base receiving the first logic signal. A second current switch circuit 1b outputs a second logic signal based on the complementary signal and the potential of an output terminal OUT1. A level shift circuit 1c shifts the level of the second logic signal and provides it to the base of a pull-down transistor Q11. When the potential of an input terminal IN1 changes from a low level to a high level, a capacitive load CL is discharged through transistors Q9 and Q11. When the potential of output terminal OUT1 becomes lower than that of a first reference potential terminal VBB1, the second logic signal attains a low level, thereby turning off pull-down transistor Q11.

12 Claims, 4 Drawing Sheets

LOGIC CIRCUIT WITH THE FUNCTION OF CONTROLLING DISCHARGE CURRENT ON PULL-DOWN AND EMITTER COUPLED LOGIC CIRCUIT

This application is a continuation of application Ser. No. 08/398,843 filed Mar. 6, 1995, now abandoned.

BACKGROUND OF THE INVENTION

1. Field of the Invention

The present invention relates to logic circuits with the function of controlling discharge current on pull-down and to emitter coupled logic (hereinafter referred to as ECL) circuits. More particularly, the present invention relates to a logic circuit allowing two-stage control of a discharge current of a capacitive load on pull down, and to an ECL circuit for outputting a first or second logic potential in response to a logic signal provided to an input terminal.

2. Description of the Background Art

Figure 4:
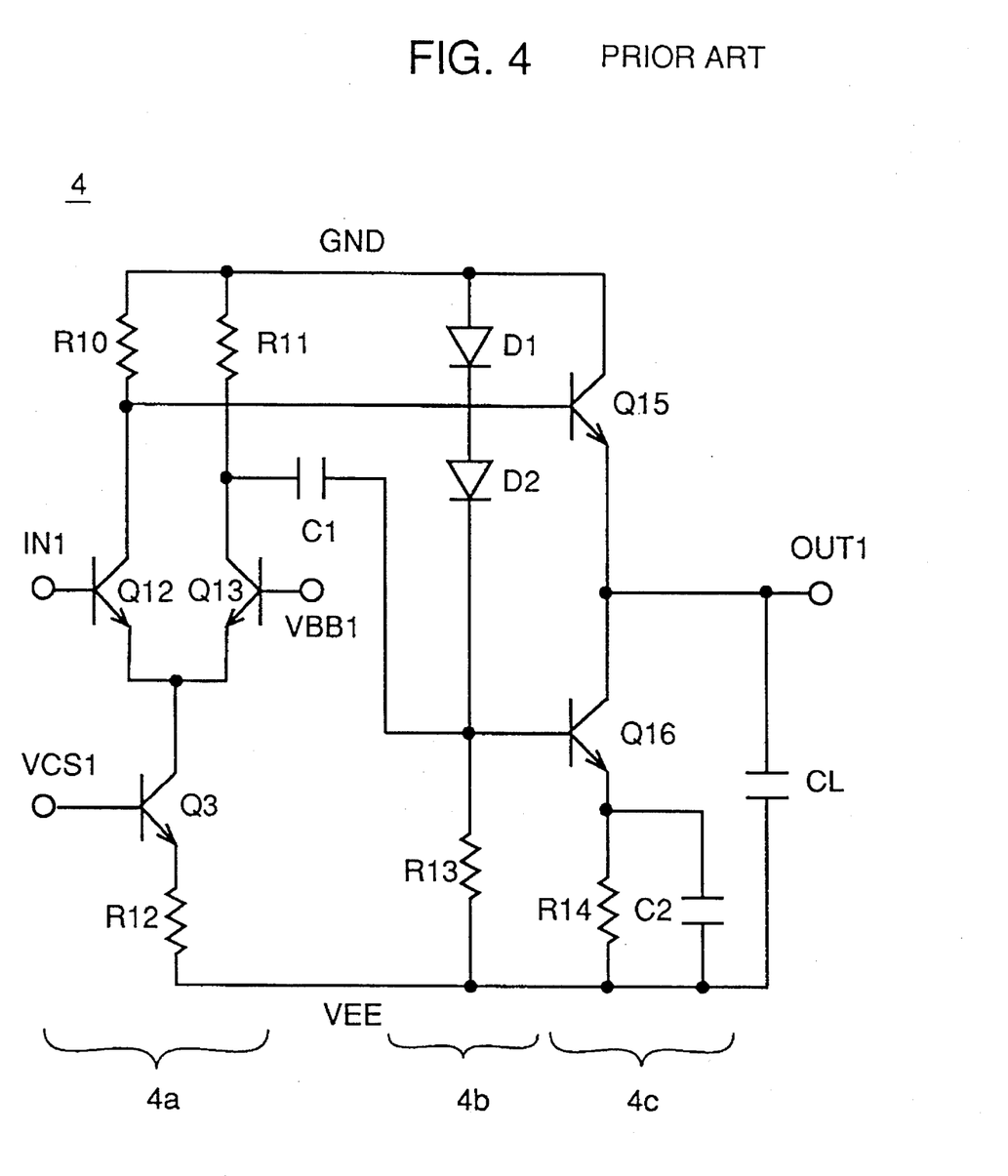
FIG. 4 is a circuit diagram showing the structure of a conventional inverter circuit.

An ECL circuit allowing high speed operation with low power consumption, in which large current is allowed to flow only when an output potential is changed from a high level to a low level by discharging capacitive load, is generally called an active pull-down ECL circuit. FIG. 4 is a circuit diagram showing a structure of a conventional active pull-down ECL circuit 4 such one as described in 1989 IEEE International Solid-State Circuits Conference pp. 224–225.

Referring to FIG. 4, active pull-down ECL circuit 4 includes a first input terminal IN1, first and second reference potential terminals VBB1, VCS1, a first output terminal OUT1, a ground potential GND, and a supply terminal VEE. A logic signal having a high level and a low level is input to first input terminal IN1. A first reference potential which is a threshold potential of a logic amplitude of the input logic signal is applied to first reference potential terminal VBB1. Ground terminal GND is connected to the ground, and a supply potential lower than the ground potential is applied to supply terminal VEE. A second reference potential higher than the supply potential is applied to second reference potential terminal VCS1. First output terminal OUT1 has a capacitive load CL including capacitance of wire and input capacitance of a gate of the next circuit.

Active pull-down ECL circuit 4 also includes a current switch circuit 4a, a bias circuit 4b, an output circuit 4c, and a capacitor C1. Current switch circuit 4a includes bipolar transistors Q12–Q14 and resistors R10–R12. Transistors Q12 and Q13 have base terminals connected to first input terminal IN1 and first reference potential terminal VBB1 respectively, collector terminals connected to ground terminal GND via resistors R10 and R11 respectively, and emitter terminals connected in common to a collector terminal of transistor Q14. Transistor Q14 has a base connected to second reference potential terminal VCS1, and an emitter terminal connected to supply terminal VEE via resistor R12.

Bias circuit 4b includes diodes D1 and D2 and a resistor R13. Diodes D1 and D2 are serially connected in a forward direction. Diode D1 has an anode terminal connected to ground terminal GND, and diode D2 has a cathode terminal connected to supply terminal VEE via resistor R13. Capacitor C1 is connected between the collector terminal of transistor Q13 and the cathode terminal of diode D2.

Output circuit 4c includes bipolar transistors Q15 and Q16, a resistor R14 and a capacitor C2. Transistor Q15 has a base terminal connected to the collector terminal of transistor Q12, a collector terminal connected to ground terminal GND, and an emitter terminal connected to first output terminal OUT1. Transistor Q16 has a base terminal connected to the cathode terminal of diode D2, a collector terminal connected to first output terminal OUT1, and an emitter terminal connected to supply terminal VEE via resistor R14. Capacitor C2 is connected in parallel to resistor R14.

Transistor Q14 and resistor R12, and transistor Q16 and resistor R14 constitute constant current sources respectively. At respective constant current sources, each of resistors R12 and R14 has each one end connected to supply terminal VEE. The potential of second reference potential terminal VCS1 or potential from the base terminal of transistor Q16 minus the on-voltage (VBE0.8 V) between the base and emitter terminals of transistors Q14 and Q16 is applied to the other end of respective resistors R12 and R14. Therefore, current of a value corresponding to the voltage applied to both ends of resistors R12 and R14 divided by the resistance of resistors R12 and R14, flows through respective constant current sources. The base terminal of transistor Q16 is biased to a lower potential by the on-voltage (VD0.8 V) of two diodes D1 and D2 than the potential of ground terminal GND.

When the input logic signal provided to first input terminal IN1 makes a transition from a high level to a low level, each transistor operates in the following manner.

Transistor Q12 turns off and transistor Q13 turns on. Accordingly, the current of the constant current source consisting of transistor Q14 and resistor R12 flows through transistor Q13 and resistor R11. No current flows through resistor R10, and thus the potential of the base terminal of transistor Q15 attains a high level. Transistor Q15 charges capacitive load CL and first output terminal OUT1 attains a high level. At this time, since current flows through resistor R11 and a node between transistor Q13 and resistor R11 attains a low level, the potential of the base terminal of transistor Q16 attains low level via capacitor C1. If the capacitance of capacitor C2 is large enough, the potential of the emitter terminal of transistor Q16 does not immediately follow the potential of the base terminal of transistor Q16 going low. As a result, the voltage between the base and emitter terminals of transistor Q16 becomes smaller than the on-voltage VBE (0.8 V), thereby turning transistor Q16 off.

When the input logic signal provided to first input terminal IN1 changes from a low level to a high level, these transistors operate in the following manner.

Transistor Q12 turns on, and transistor Q13 turns off. Therefore, the current of the constant current source consisting of transistor Q14 and resistor R12 flows through transistor Q12 and resistor R10. As a result, the potential of the base terminal of transistor Q15 attains a low level. Since no current flows through transistor Q13 at this time, the collector terminal of transistor Q13 connected to resistor R11 makes a transition to a high level. Consequently, the potential of the base terminal of transistor Q16 becomes high. Provided that the capacitance of capacitor C2 is large enough, the potential of the emitter terminal of transistor Q16 does not immediately follow the high going potential of the base terminal of transistor Q16. As a result, the voltage between the base and emitter terminals of transistor Q16 becomes greater than the on-voltage VBE (0.8 V), thereby turning on transistor Q16. The current exponentially proportional to the potential of the base terminal of transistor Q16 flows through transistor Q16, thereby rapidly discharging capacitive load CL, and the potential of first output terminal OUT1 attains a low level. This circuit thus implements the logic of an inverter.

As described above, capacitors C1 and C2 are used for controlling discharging current at the time of pull down in the conventional active pull-down ECL circuit 4, and therefore a high-cost process technique including the steps of making capacitors is required for its manufacture.

SUMMARY OF THE INVENTION

Therefore, a first object of the present invention is to provide an emitter coupled logic circuit which allows control of discharging current at the time of pull down without using a capacitor.

Briefly speaking, in the emitter coupled logic circuit of the present invention, a first current switch circuit outputs a first logic signal and its complementary signal in response to an input logic signal, and a second current switch circuit outputs a second logic signal based on the potential of an output terminal and the complementary signal. A level shift circuit shifts the level of the logic potential of the second logic signal. An output circuit controls the potential of the output terminal based on the first logic signal and the level-shifted second logic signal. Therefore, discharging current can be controlled at the time of pull down in response to the potential of the output terminal without using a capacitor.

A second object of the present invention is to provide a logic circuit with the function of controlling discharge current on pull-down which allows two-stage control of discharging current at the time of pull-down without using a capacitor.

In the logic circuit with the function of controlling discharge current on pull down, a first current switch circuit outputs a first logic signal and its complementary signal in response to an input logic signal, and a second current switch circuit outputs a second logic signal based on the potential of an output terminal and the complementary signal. A level shift circuit shifts the level of the logic potential of the second logic signal. An output circuit controls the potential of the output terminal based on the first logic signal and the level-shifted second logic signal. Therefore, discharging current can be controlled at the time of pull down in response to the potential of the output terminal without using a capacitor.

Preferably, first electrodes of one and the other of a first differential transistor pair in the first current switch circuit are connected in common to a first current source. The first logic signal and its complementary signal are output from second electrodes of one and the other of the first differential transistor pair. First electrodes of one and the other of a second differential transistor pair in the second current switch circuit are connected in common to a second current source. A second electrode of the other transistor of the second pair is connected through a resistor to the second electrode of the other transistor of the first pair, and the second logic signal is output from the second electrode of the other transistor of the second pair.

Preferably, the level shift circuit includes first and second level shift transistors.

The output circuit preferably includes a pull-up transistor and a pull-down transistor. The logic signal output from the first current switch circuit is input to an input electrode of the pull-up transistor, and the logic signal output from the level shift circuit is input to an input electrode of the pull-down transistor.

In accordance with a preferred embodiment of the present invention, a delay circuit is provided for delaying input of potential change of the output terminal to the input electrode of one of the second differential transistor pair, thereby delaying a change of the second logic signal in response to the potential change of the output terminal. For example, on-time of the pull-down transistor becomes longer and discharging current at the time of pull down is increased, thereby allowing a high-speed operation of the circuit.

In accordance with another preferred embodiment of the present invention, at least one input transistor connected in parallel to one of the first differential transistor pair, and an input terminal connected to the input electrode of each input transistor are provided, thereby constituting a multi-input logic circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
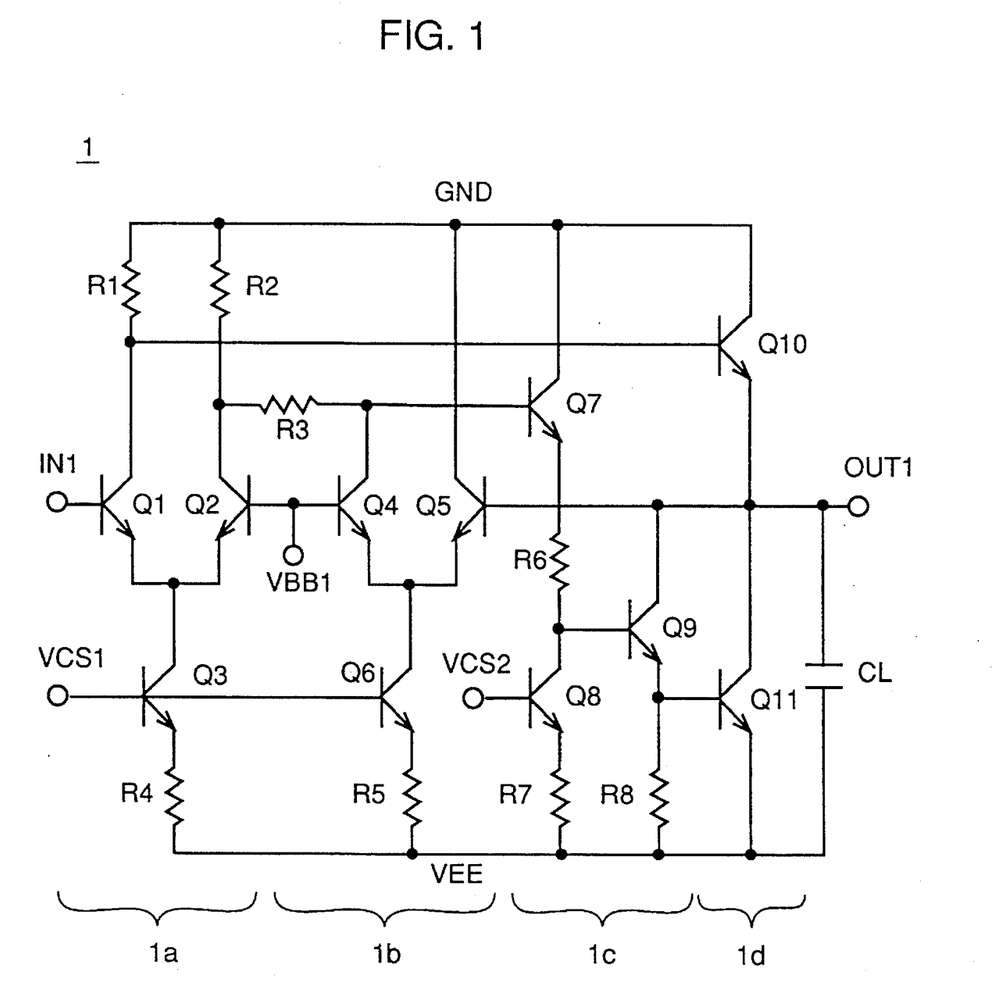
FIG. 1 is a circuit diagram showing the structure of an inverter circuit in accordance with a first embodiment of the present invention.

FIG. 1 is a circuit diagram showing the structure of an inverter circuit 1 in accordance with a first embodiment of the present invention. Referring to FIG. 1, inverter circuit 1 includes a first input terminal IN1, a first output terminal OUT1, a ground terminal GND, a supply terminal VEE, and first, second and third reference potential terminals VBB1, VCS1, and VCS2. A logic signal having a high level and a low level is input to the first input terminal. A first reference potential, which is a threshold potential of a logic amplitude of the input logic signal is applied to first reference potential terminal VBB1. Ground terminal GND is connected to the ground, and a supply potential lower than the ground potential is applied to supply potential VEE. Second and third reference potentials higher than the supply potential are applied to second and third reference potential terminals VCS1 and VCS2, respectively. First output terminal OUT1 has a capacitive load including capacitance of wire and input capacitance of the gate of the next circuit.

Inverter circuit 1 includes first and second current switch circuits 1a and 1b, a level shift circuit 1c and an output circuit 1d. First current switch circuit 1a includes bipolar transistors Q1–Q3 and resistors R1, R2, and R4. Transistors Q1, Q2 (a first differential transistor pair) have base terminals connected to first input terminal IN1 and first reference potential terminal VBB1 respectively, collector terminals connected to ground terminal GND through resistors R1 and R2 respectively, and emitter terminals connected in common to a collector terminal of transistor Q3. Transistor Q3 has a base terminal connected to second reference potential terminal VCS1, and an emitter terminal connected to supply terminal VEE via resistor R4.

Second current switch circuit 1b includes bipolar transistors Q4–Q6 and resistors R3 and R5. Transistors Q4 and Q5 (a second differential transistor pair) have base terminals connected to first reference potential terminal VBB1 and first output terminal OUT1 respectively, and emitter terminals connected in common to a collector terminal of transistor Q6. Transistor Q4 has a collector terminal connected to the collector terminal of transistor Q2 via resistor R3, while transistor Q5 has a collector terminal connected to ground terminal GND. Transistor Q6 has a base terminal connected to second reference potential terminal VCS1 and an emitter terminal connected to supply terminal VEE via resistor R5.

Level shift circuit 1c includes transistors Q7-Q9 and resistors R6–R8. Transistor Q7 (a first level shift transistor) has a base terminal connected to the collector terminal of transistor Q4, a collector terminal connected to ground terminal GND, and an emitter terminal connected to a base terminal of transistor Q9 (a second level shift transistor) via resistor R6. Transistor Q9 has a collector terminal connected to first output terminal OUT1, and an emitter terminal connected to supply terminal VEE via resistor R8. Transistor Q8 has a base terminal connected to third reference potential terminal VCS2, and an emitter terminal connected to supply terminal VEE via resistor R7.

Output circuit 1d includes bipolar transistors Q10 and Q11. Transistor Q10 (pull-up transistor) has a base terminal connected to the collector terminal of transistor Q1, a collector terminal connected to ground terminal GND, and an emitter terminal connected to first output terminal OUT1. Transistor Q11 (pull-down transistor) has a base terminal connected to the emitter terminal of transistor Q9, a collector terminal connected to first output terminal OUT1, and an emitter terminal connected to supply terminal VEE.

Transistor Q3 and resistor R4, transistor Q6 and resistor R5, and transistor Q8 and resistor R7 form constant current sources, respectively. At respective constant current sources, resistors R4, R5 and R7 each have one end connected to supply terminal VEE. The potential applied to second or third reference potential terminal VCS1 or VCS2 minus the on-voltage (VBE0.8 V) between the base and emitter terminals of transistors Q3, Q6 and Q8 is applied to the other end of respective resistors R4, R5 and R7. Therefore, the current of a value corresponding to the voltage applied to both ends of resistors R4, R5 and R7 divided by the resistance of resistors R4, R5 and R7 flows through respective constant current sources.

When the input logic signal provided to first input terminal IN1 changes from a high level to a low level, these transistors operate in the following manner.

Transistor Q1 turns off and transistor Q2 turns on. As a result, the current of the constant current source consisting of transistor Q3 and resistor R4 flows through resistor R2 via transistor Q2. No current flows through resistor R1, so that the potential of the base terminal of transistor Q10 changes to a high level. Capacitive load CL is charged through transistor Q10 and first output terminal OUT1 attains a high level.

Since the potential of first output terminal OUT1, that is the potential of the base terminal of transistor Q5 is at the high level, transistor Q5 turns on and transistor Q4 turns off.

The current of the constant current source consisting of transistor Q6 and resistor R5 flows through transistor Q5. The potential of the base terminal of transistor Q7 is lower than that of ground terminal GND by the amount equal to the product of the resistance of resistor R2 and the current at the constant current source formed by transistor Q3 and resistor R4.

The base terminal of transistor Q9 receives a potential even lower than the potential applied to the base terminal of transistor Q7 by the sum of the on-voltage VBE (0.8 V) between the base and emitter terminals of transistor Q7 and the product of the current at the constant current source of transistor Q8 and resistor R7 and the resistance of resistor R6. Resistor R8 has one end connected to supply terminal VEE, and the other end thereof receives a potential lower than that of the base terminal of transistor Q9 by the on-voltage VBE (0.8 V) between the base and emitter terminals. Therefore, the current of a value corresponding to the voltage applied to both ends of resistor R8 divided by the resistance of resistor R8 flows through transistors Q10 and Q9 via resistor R8.

At this time, the potential of the base terminal of transistor Q11 is set such that the voltage between the base and emitter terminals of transistor Q11 is lower than the on-voltage VBE (0.8 V) between the base and emitter terminals thereof. The potential of the base terminal of transistor Q11 can be set by adjusting the resistance of resistors R2, R3 and R6 and the value of current flowing through the constant current source. Since the voltage between the base and emitter terminals of transistor Q11 is lower than the on-voltage VBE (0.8 V) between the base and emitter terminals, transistor Q11 is off.

When the input logic signal applied to first input terminal IN1 changes from a low level to a high level, these transistors operate in the following manner.

Transistor Q1 turns on and transistor Q2 turns off. Therefore, the current of the constant current source formed by transistor Q3 and resistor R4 flows through resistor R1 via transistor Q1, thereby bringing the potential of the base terminal of transistor Q10 to a low level. At this time, no current flows through transistor Q2, so that the collector terminal of transistor Q2 connected to resistor R2 makes a transition to a high level. As a result, the potential of the base terminal of transistor Q7 becomes higher by that amount, and therefore the potential of the base terminal of transistor Q9 becomes high through the level shift circuit consisting of transistor Q7 and resistor R6 and transistor Q8 and resistor R7.

At this time, if the potential of the base terminal of transistor Q11 is set such that the voltage between the base and emitter terminals of transistor Q11 is greater than the on-voltage VBE (0.8 V) between the base and emitter terminals thereof, capacitive load CL is discharged through transistor Q9 and resistor R8 and transistor Q11.

when capacitive load CL is discharged with the emitter terminal of transistor Q9 connected to resistor R8, capacitive load CL is discharged by the current corresponding to the voltage applied to both ends of resistor R8 divided by the resistance of resistor R8. Consequently, even when the potential of the base terminal of transistor Q9 becomes high, increase in current is small and capacitive load CL cannot be rapidly discharged. However, since the emitter terminal of transistor Q11 is directly connected to supply terminal VEE, current exponentially proportional to the voltage of the base terminal thereof flows through transistor Q11 so that capacitive load CL can be rapidly discharged.

When capacitive load CL of first output terminal OUT1 is discharged and the potential of first output terminal OUT1 becomes lower than that of first reference potential terminal VBB1, transistor Q4 turns on and transistor Q5 turns off. The current of the constant current source formed by transistor Q6 and resistor R5 flows through resistors R3 and R2 via transistor Q4. The potential of the base terminal of transistor Q7 is lower than that of ground terminal GND by the product of the resistance of resistors R2 and R3 and the current of the constant current source formed by transistor Q6 and resistor R5. Therefore, the potential of the base terminal of transistor Q9 is biased to an even lower voltage than the potential of the base terminal of transistor Q7 by the sum of the on-voltage VBE (0.8 V) between the base and emitter terminals of transistor Q7 and the product of the resistance of resistor R6 and the current of the constant current source formed by transistor Q8 and resistor R7.

Resistor R8 has one end connected to supply terminal VEE and the other end thereof receives a voltage lower than the potential of the base terminal of transistor Q9 by the on-voltage VBE (0.8 V) between the base and emitter terminals. The current of a value corresponding to this voltage divided by the resistance of resistor R8 flows through transistors Q10 and Q9 and resistor R8. At this time, the potential of the base terminal of transistor Q11 is set such that the voltage between the base and emitter terminals of transistor Q11 is lower than the on-voltage VBE (0.8 V) between the base and emitter terminals thereof. Consequently, transistor Q11 turns off.

Therefore, in this circuit, when the potential of first output terminal OUT1 becomes lower than that applied to first reference potential terminal VBB1, capacitive load CL is discharged only by the current path formed by transistor Q9 and resistor R8, whereby the potential of first output terminal OUT1 attains a low level.

This circuit implements the logic of an inverter in the above-described manner. In this circuit, the current, which discharges capacitive load at the time of pull down when the output voltage makes a transition from a high level to a low level, can be controlled in two stages without using a capacitor.

Second Embodiment

Figure 2:
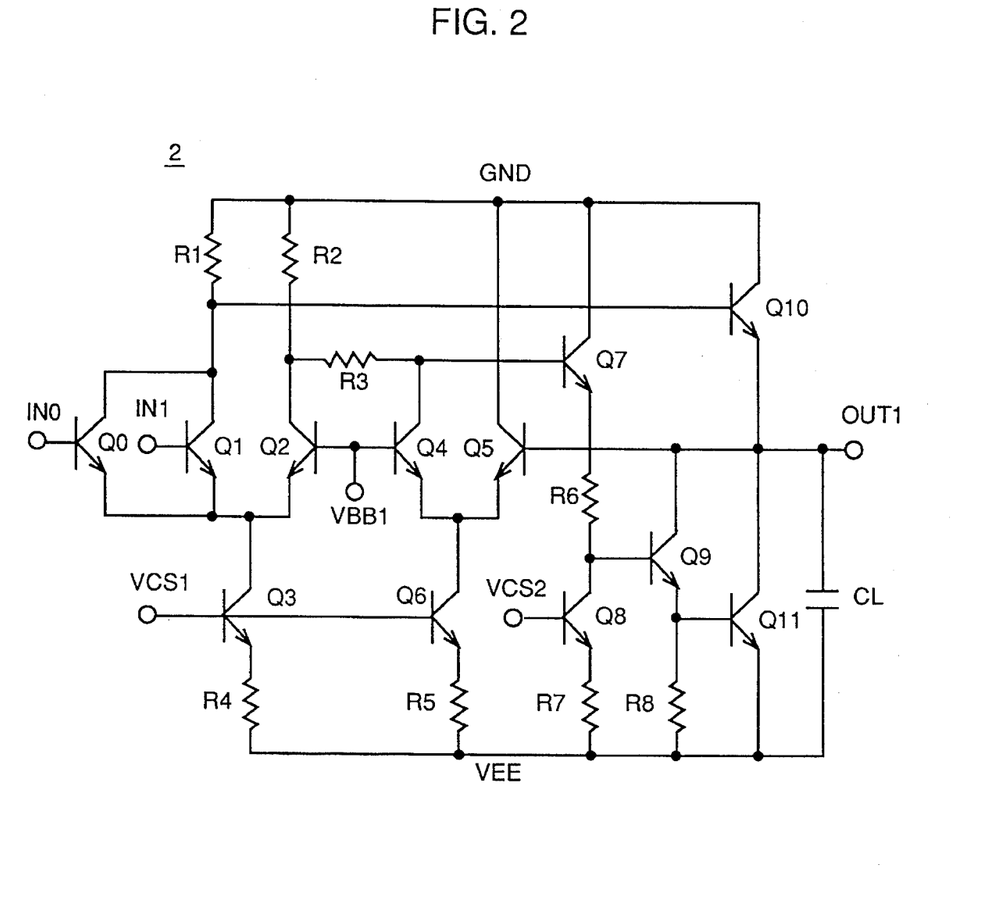
FIG. 2 is a circuit diagram showing the structure of a two-input NOR circuit in accordance with a second embodiment of the present invention.

FIG. 2 is a circuit diagram showing the structure of a two-input NOR circuit 2 in accordance with a second embodiment of the present invention. Referring to FIG. 2, in two-input NOR circuit 2, a bipolar transistor Q0 having a base terminal connected to a second input terminal IN0 is connected in parallel to bipolar transistor Q1 having the base terminal connected to first input terminal IN1 in inverter circuit 1 shown in FIG. 1.

In this circuit, if the input logic signal applied to first input terminal IN1 is at a high level and an input logic signal applied to second input terminal IN0 is at a low level, transistor Q1 turns on, transistor Q0 turns off, and transistor Q2 turns off. As a result, the current of the constant current source formed by transistor Q3 and resistor R4 flows through resistor R1 via transistor Q1.

Similarly, if the input logic signal applied to first input terminal IN1 is at a low level and the input logic signal applied to second input terminal is at a high level, transistor Q0 turns on, transistor Q1 turns off and transistor Q2 turns off. Consequently, the current of the constant current source formed by transistor Q3 and resistor R4 flows through resistor R1 via transistor Q0.

When the input logic signal applied to first input terminal IN1 is also at the high level and the input logic signal applied to second input terminal IN0 is also at the high level, transistor Q1 turns on, transistor Q0 turns on and transistor Q2 turns off. At this time, the current of the constant current source formed by transistor Q3 and resistor R4 flows through resistor R1 via transistors Q1 and Q0. With the input logic signals in such a condition, current flows through resistor R1 and first output terminal OUT1 attains a low level.

When both input logic signals applied to first and second input terminals IN1 and IN0 are at a low level, transistor Q2 turns on, transistor Q1 turns off and transistor Q0 turns off. In this situation, the current of the constant current source flows from transistor Q3 and resistor R4 through transistor Q2 to resistor R2. Therefore no current flows through resistor R1 and first output terminal OUT1 attains a high level. The other transistors operate similarly to inverter circuit 1 in FIG. 1. This circuit thus implements the two-input NOR logic.

Although a two-input NOR circuit is illustrated as an example in this embodiment, a multi-input NOR circuit can be developed by similarly connecting in parallel the transistors each having a base terminal connected to an input terminal.

Third Embodiment

Figure 3:
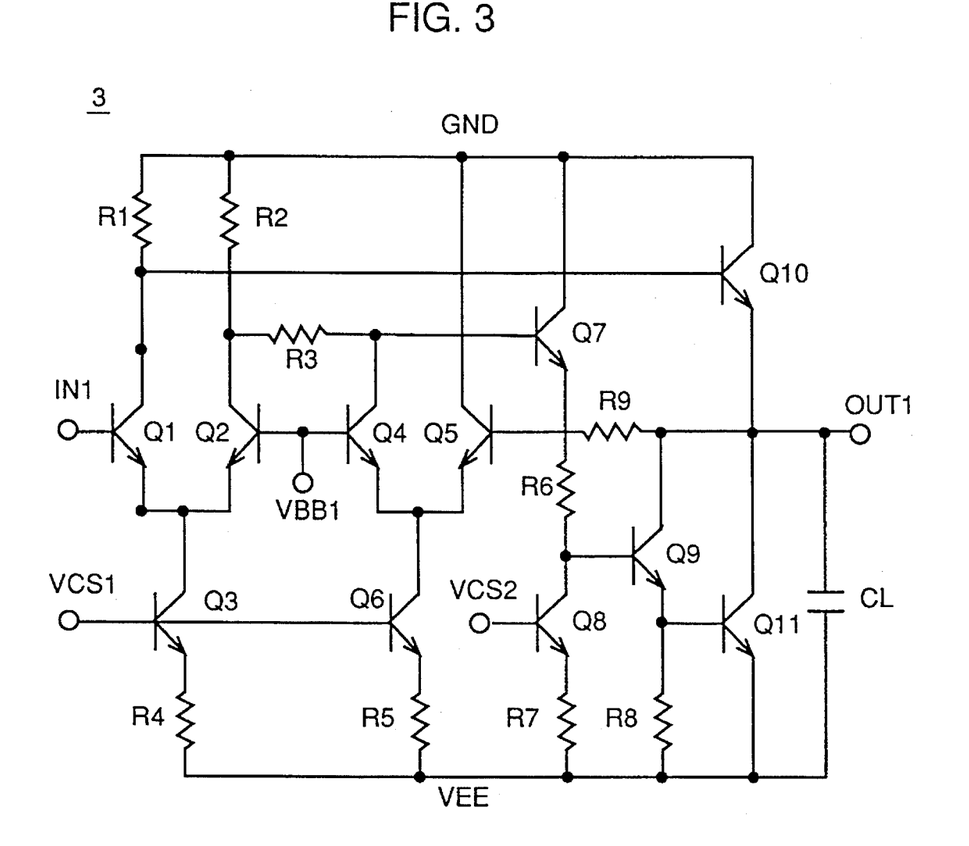
FIG. 3 is a circuit diagram showing the structure of an inverter circuit in accordance with a third embodiment of the present invention.

FIG. 3 is a circuit diagram showing the structure of an inverter circuit 3 in accordance with a third embodiment of the present invention. Referring to FIG. 3, in inverter circuit 3, a resistor R9 (a delay circuit) is connected between first output terminal OUT1 and the base terminal of transistor Q5 of inverter circuit 1 shown in FIG. 1.

Now, operation of inverter circuit 3 shown in FIG. 3 will be described. In inverter circuit 1 shown in FIG. 1, when the input logic signal applied to first input terminal IN1 changes from a low level to a high level, if the potential of first output terminal OUT1 is higher than that of first reference potential terminal VBB1, transistor Q5 turns on, transistor Q4 turns off, and transistor Q11 turns on, so that capacitive load CL is discharged through transistor Q11 as well as the current path formed by transistor Q9 and resistor R8. In inverter circuit 1 shown in FIG. 1, a delay time in which a change in the potential of first output terminal OUT1 is transmitted to transistor Q5 is small.

When resistor R9 is connected between first output terminal OUT1 and the base terminal of transistor Q5 as in this circuit, the delay time in which a change in the potential of first output terminal OUT1 is transmitted to transistor Q5 is greater because of a delay time due to time constant of resistor R9 and parasitic capacitance of the base terminal of transistor Q5. Therefore, even when the potential of first output terminal OUT1 becomes lower than that of first reference potential terminal VBB1, this will not cause immediate turn off of transistor Q5 and turn on of transistor Q4, and transistor Q11 is kept on, whereby the current exponentially proportional to the voltage of the base terminal of transistor Q11 continues to discharge capacitive load CL rapidly. Thus, this circuit can operate at a higher speed than inverter circuit 1 of FIG. 1. The other transistors operate similarly to inverter circuit 1 shown in FIG. 1.

Although an inverter circuit is illustrated as an example in this embodiment, this circuit can also be applied to a two-input NOR circuit or a multi-input NOR circuit by connecting resistor R9 between first output terminal OUT1 and the base terminal of transistor Q5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An emitter coupled logic circuit for outputting a first or second logic potential to an output terminal in response to a logic signal input to an input terminal, comprising:

a first current switch circuit including a first differential transistor pair one transistor of which has an input electrode connected to said input terminal, and outputting a first logic signal and a complementary signal thereof in response to said input logic signal;

a second current switch circuit including a second differential transistor pair one transistor of which has an input electrode connected to said output terminal, and outputting a second logic signal based on the potential of the output terminal and the complementary signal output from said first current switch circuit;

a level shift circuit for shifting a level of the second logic signal output from said second current switch circuit so as to lower a logic potential thereof by a prescribed potential; and an output circuit for controlling the potential of said output terminal based on the first logic signal output from said first current switch circuit and the second logic signal having the level shifted by said level shift circuit.

2. The emitter coupled logic circuit according to claim 1, wherein said first current switch circuit further includes a first current source, one and the other transistors of said first differential transistor pair have first electrodes both connected to said first current source, and second electrodes providing said first logic signal and said complementary signal respectively, and wherein said second current switch circuit further includes a second current source and a resistor, one and the other transistors of said second differential transistor pair have first electrodes both connected to said second current source, and said the other transistor has a second electrode connected to the second electrode of the other transistor of said first differential transistor pair through said resistor and providing said second logic signal.

3. The emitter coupled logic circuit according to claim 1, wherein said level shift circuit includes a first level shift transistor receiving said second logic signal at an input electrode and outputting from a first electrode the logic potential of the second logic signal lowered by a prescribed potential, and a second level shift transistor having an input electrode connected to the first electrode of said first level shift transistor, a second electrode connected to said output terminal, and a first electrode providing the logic potential of said second logic signal lowered even further by a prescribed potential.

4. The emitter coupled logic circuit according to claim 1, wherein said output circuit includes a pull-up transistor having an input electrode which receives the first logic signal output from said first current switch circuit, and a first electrode connected to said output terminal, and a pull-down transistor having an input electrode which receives the second logic signal having the level shifted by said level shift circuit, and a second electrode connected to said output terminal.

5. The emitter coupled logic circuit according to claim 1, further comprising a delay circuit connected between said output terminal and the input electrode of said one transistor of said second differential transistor pair for delaying input of a potential change of said output terminal to said input electrode.

6. The emitter coupled logic circuit according to claim 1, further comprising at least one input transistor connected in parallel to said one transistor of said first differential transistor pair and an input terminal connected to an input electrode of each input transistor.

7. A logic circuit with the function of controlling discharge current on pull-down for outputting a first or second logic potential to an output terminal in response to a logic signal input to an input terminal, comprising:

a first current switch circuit including a first differential transistor pair one transistor of which has an input electrode connected to said input terminal, and outputting a first logic signal and a complementary signal thereof in response to said input logic signal;

a second current switch circuit including a second differential transistor pair one transistor of which has an input electrode connected to said output terminal, and outputting a second logic signal based on the potential of the output terminal and the complementary signal output from said first current switch circuit;

a level shift circuit for shifting a level of the second logic signal output from said second current switch circuit so as to lower a logic potential thereof by a prescribed potential; and an output circuit for controlling the potential of said output terminal based on the first logic signal output from said first current switch circuit and the second logic signal having the level shifted by said level shift circuit.

8. The logic circuit with the function of controlling discharge current on pull-down according to claim 7, wherein said first current switch circuit further includes a first current source, one and the other transistors of said first differential transistor pair have first electrodes both connected to said first current source, and second electrodes providing said first logic signal and said complementary signal respectively, and wherein said second current switch circuit further includes a second current source and a resistor, one and the other transistors of said second differential transistor pair have first electrodes both connected to said second current source, and said the other transistor has a second electrode connected to the second electrode of the other transistor of said first differential transistor pair through said resistor and providing said second logic signal.

9. The logic circuit with the function of controlling discharge current on pull-down according to claim 7, wherein said level shift circuit includes a first level shift transistor receiving said second logic signal at an input electrode and outputting from a first electrode the logic potential of the second logic signal lowered by a prescribed potential, and a second level shift transistor having an input electrode connected to the first electrode of said first level shift transistor, a second electrode connected to said output terminal, and a first electrode providing the logic potential of said second logic signal lowered even further by a prescribed potential.

10. The logic circuit with the function of controlling discharge current on pull-down according to claim 7, wherein said output circuit includes a pull-up transistor having an input electrode which receives the first logic signal output from said first current switch circuit, and a first electrode connected to said output terminal, and a pull-down transistor having an input electrode which receives the second logic signal having the level shifted by said level shift circuit, and a second electrode connected to said output terminal.

11. The logic circuit with the function of controlling discharge current on pull-down according to claim 7, further comprising a delay circuit connected between said output terminal and the input electrode of said one transistor of said second differential transistor pair for delaying input of a potential change of said output terminal to said input electrode.

12. The logic circuit with the function of controlling discharge current on pull-down according to claim 7, further comprising at least one input transistor connected in parallel to said one transistor of said first differential transistor pair and an input terminal connected to an input electrode of each input transistor.

* * * * *